United States Patent
Codding et al.

(10) Patent No.: US 7,700,488 B2
(45) Date of Patent: Apr. 20, 2010

(54) RECYCLING OF ION IMPLANTATION MONITOR WAFERS

(75) Inventors: Steven Ross Codding, Underhill Center, VT (US); Joseph R. Greco, South Burlington, VT (US); Timothy Charles Krywanczyk, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 518 days.

(21) Appl. No.: 11/623,354

(22) Filed: Jan. 16, 2007

(65) Prior Publication Data
US 2008/0171439 A1    Jul. 17, 2008

(51) Int. Cl.
*H01L 21/302* (2006.01)
*H01L 21/461* (2006.01)

(52) U.S. Cl. ............ 438/690; 438/691; 438/692; 438/693; 216/83; 216/84

(58) Field of Classification Search ........... 438/690, 438/691, 692, 693; 216/83, 84
See application file for complete search history.

(56) References Cited

U.S. PATENT DOCUMENTS

| | | | | |
|---|---|---|---|---|
| 5,622,875 A | * | 4/1997 | Lawrence | 438/691 |
| 5,981,301 A | * | 11/1999 | Muramatsu et al. | 438/4 |
| 6,140,208 A | * | 10/2000 | Agahi et al. | 438/437 |
| 6,342,450 B1 | * | 1/2002 | Lattard | 438/696 |
| 6,752,694 B2 | | 6/2004 | Schneegans et al. | |
| 6,917,433 B2 | | 7/2005 | Levy et al. | |
| 7,037,854 B2 | | 5/2006 | Bachrach et al. | |
| 2001/0029072 A1 | * | 10/2001 | Kuwahara et al. | 438/151 |
| 2003/0219957 A1 | * | 11/2003 | Kuwabara et al. | 438/400 |
| 2004/0112866 A1 | * | 6/2004 | Maleville et al. | 216/83 |
| 2006/0246689 A1 | * | 11/2006 | Takano et al. | 438/459 |

FOREIGN PATENT DOCUMENTS

JP    9237771 A    9/1997

* cited by examiner

*Primary Examiner*—Duy-Vu N Deo
(74) *Attorney, Agent, or Firm*—Schmeiser, Olsen & Watts; Riyon W. Harding

(57) ABSTRACT

A wafer processing method. The method includes providing a semiconductor wafer. The semiconductor wafer includes (i) a semiconductor layer and (ii) a dopant layer on top of the semiconductor layer. The dopant layer comprises dopants. The method further includes removing the dopant layer from the semiconductor wafer. No chemical etching is performed on the dopant layer before said removing the dopant layer is performed.

37 Claims, 3 Drawing Sheets

US 7,700,488 B2

RECYCLING OF ION IMPLANTATION MONITOR WAFERS

FIELD OF THE INVENTION

The present invention relates generally to ion implantation monitor wafers and more particularly to recycling of ion implantation monitor wafers.

BACKGROUND OF THE INVENTION

Ion implantation monitor wafers are used to monitor ion implantation tools. More specifically, a monitor wafer is put in an ion implantation tool and the ion implantation process is performed on the monitor wafer. Then, the monitor wafer is taken out of the ion implantation tool and the doping dose on the monitor wafer is measured to determine if the ion implantation process is within specification. The ion implantation monitor wafers are expensive. Therefore, there is a need for a method for recycling ion implantation monitor wafers.

SUMMARY OF THE INVENTION

The present invention provides a wafer processing method, comprising providing a semiconductor wafer which includes (i) a semiconductor layer and (ii) a dopant layer on top of the semiconductor layer, wherein the dopant layer comprises dopants; and removing the dopant layer from the semiconductor wafer, wherein no chemical etching is performed on the dopant layer before said removing the dopant layer is performed.

The present invention provides a wafer processing method, comprising providing a semiconductor wafer which includes (i) a semiconductor layer and (ii) a dopant layer on top of the semiconductor layer, wherein the dopant layer comprises dopants; removing the dopant layer from the semiconductor wafer; and performing a chemical mechanical polishing (CMP) process on a top surface of the semiconductor wafer on which the dopant layer resided a using CMP apparatus.

The present invention provides a wafer processing method, comprising providing a semiconductor wafer which includes (i) a semiconductor layer and (ii) a dopant layer on top of the semiconductor layer, wherein the dopant layer comprises dopants; removing the dopant layer from the semiconductor wafer; wherein no chemical etching is performed on the dopant layer before said removing the dopant layer is performed; performing a chemical mechanical polishing (CMP) process on a top surface of the semiconductor wafer on which the dopant layer resided using a CMP apparatus; and implanting dopants in the resulting semiconductor wafer after said removing the dopant layer from the semiconductor wafer is performed The present invention provides a method for recycling ion implantation monitor wafers.

DETAILED DESCRIPTION OF THE INVENTION

Figure 1A:
FIG. 1A shows a cross-section view of a monitor wafer, in accordance with embodiments of the present invention.
Figure 1B:
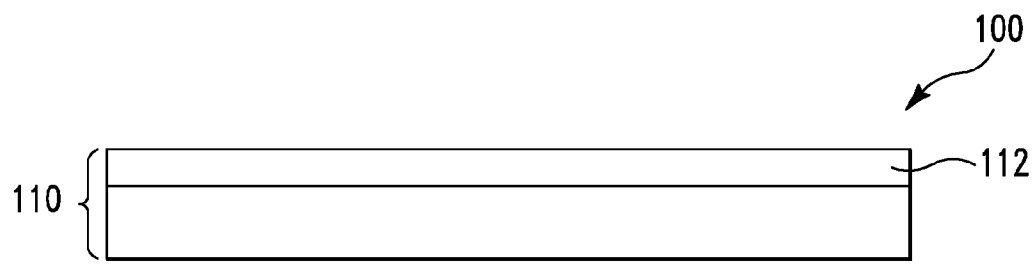
FIG. 1B shows a cross-section view of the monitor wafer of FIG. 1A after a dopant implantation process and a thermal activation are performed, in accordance with embodiments of the present invention.

FIG. 1A shows a cross-section view of a monitor wafer 110, in accordance with embodiments of the present invention. More specifically, the monitor wafer 110 is a silicon wafer that is used for monitoring a dopant implantation process (as opposed to a product wafer which is a silicon wafer on which semiconductor devices are formed). More specifically, the monitor wafer 110 can be placed in a dopant implantation tool (not shown) and the dopant implantation process is performed on the monitor wafer 110. Then, the monitor wafer 110 (i) is taken out of the dopant implantation tool and (ii) is annealed so as to thermally activate the implanted dopants using a conventional method such as RTA (rapid thermal anneal). It should be noted that after the dopant implantation process and the thermal activation are performed, a dopant layer 112 (shown in FIG. 1B) comprising the implanted dopants is created at top of the monitor wafer 110 (FIG. 1B). It should be noted that the dopant layer 112 is created by adding a certain percentage of foreign atoms in the regular crystal lattice of the monitor wafer 110 of FIG. 1A. More specifically, the foreign atoms are arsenic, phosphorus, aluminum, and gallium, etc. It should be noted that the dopant layer 112 may be n-type or p-type semiconductor responding to the foreign atoms which are added in the regular crystal lattice of the monitor wafer 110 of FIG. 1A.

Next, in one embodiment, the doping dose of the dopant layer 112 of the monitor wafer 110 is measured using a 4-point RS measuring probe (not shown). More specifically, the 4-point RS measuring probe is used to measure the sheet resistance of the monitor wafer 110, and from the results, the doping dose can be determined. As a result, from the determined doping dose, it can be determined whether the dopant implantation process is within specification.

Figure 2:
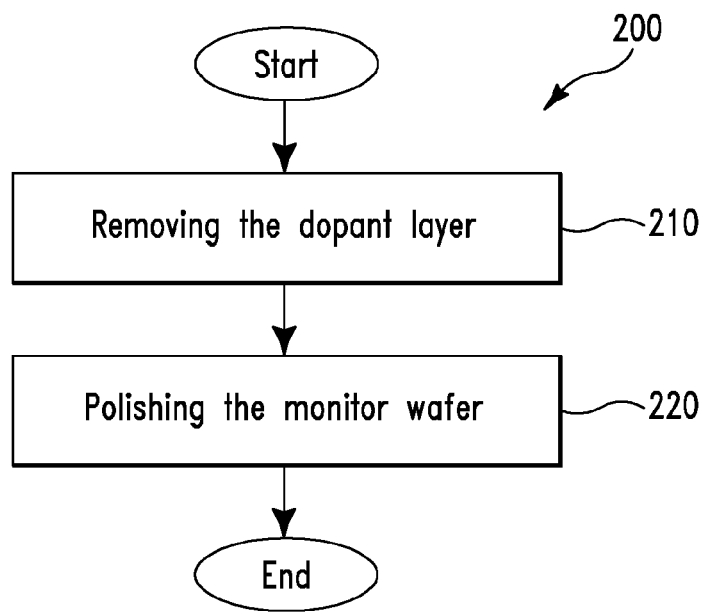
FIG. 2 shows a flowchart that illustrates a method for recycling the monitor wafer of FIG. 1B, in accordance with embodiments of the present invention.

FIG. 2 shows a flowchart that illustrates a method 200 for recycling the monitor wafer 110 of FIG. 1B, in accordance with embodiments of the present invention. More specifically, in one embodiment, the method 200 starts with a step 210 in which the dopant layer 112 (FIG. 1B) of the monitor wafer 110 (FIG. 1B) is removed. More specifically, in one embodiment, the dopant layer 112 of the monitor wafer 110 is removed by using a two-step grinding process—a coarse grinding process followed by a fine grinding process.

Figure 3A:
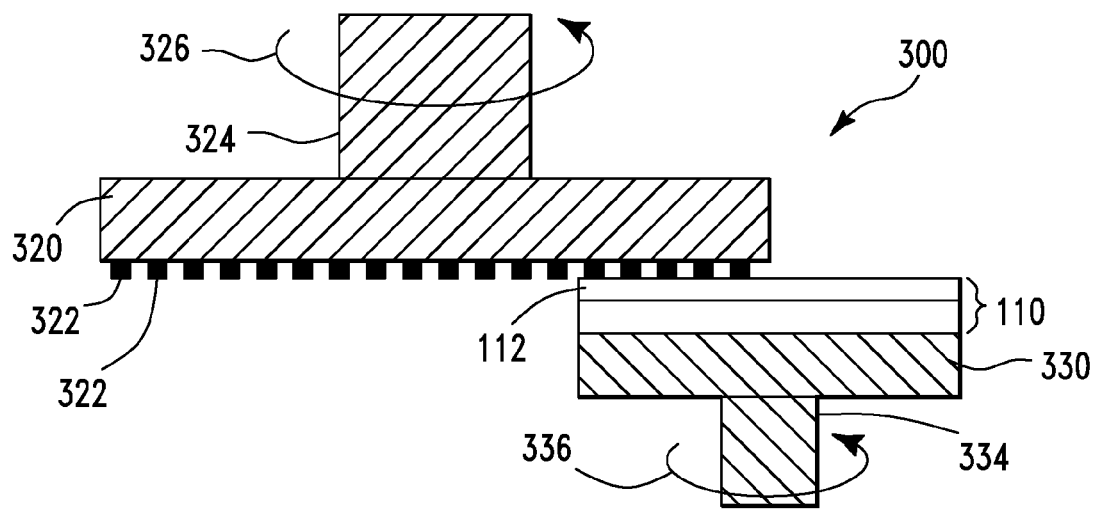
FIG. 3A shows a cross-section view of a coarse grinding tool, in accordance with embodiments of the present invention.

FIG. 3A shows a cross-section view of a coarse grinding tool 300, in accordance with embodiments of the present invention. More specifically, in one embodiment, the coarse grinding tool 300 comprises a coarse grinding wheel 320 and a chuck 330 below the coarse grinding wheel 320. Illustratively, the coarse grinding wheel 320 contains diamond particles 322 of specific dimensions held to the coarse grinding wheel 320 by a bonding material such as epoxy or ceramic (not shown). In one embodiment, the monitor wafer 110 is physically attached to the chuck 330 such that the non-doped side of the monitor wafer 110 (i.e., the side of the monitor wafer 110 which is not ion implanted) is in direct physical contact with the top surface of the chuck 330.

Figure 3B:
FIG. 3B shows a cross-section view of the monitor wafer of FIG. 1B after the coarse grinding process is performed, in accordance with embodiments of the present invention.

In one embodiment, the coarse grinding tool 300 further comprises a rotary driving unit 324 connected to the coarse grinding wheel 320 and a rotary driving unit 334 connected to the chuck 330. Illustratively, the rotary driving unit 324 rotates in a direction indicated by arrow 326 resulting in the coarse grinding wheel 320 rotating in the same direction. In one embodiment, the rotary driving unit 334 rotates in a direction indicated by arrow 336 resulting in the chuck 330 rotating in the same direction. Illustratively, during the coarse grinding process, the coarse grinding wheel 320 comes down on the top surface of the dopant layer 112 such that the diamond particles 322 of the coarse grinding wheel 320 is in direct physical contact with the top surface of the dopant layer 112. As a result, every point on the top surface of the dopant layer 112 comes into contact with the diamond particles 322 of the coarse grinding wheel 320 resulting in the dopant layer 112 is thinned until the dopant layer 112 is removed from the monitor wafer 110. In one embodiment, it can be determined that the dopant layer 112 is completely removed from the monitor wafer 110 by using the 4-point RS measuring probe to measure the sheet resistance of the monitor wafer 110. FIG. 3B shows a cross-section view of the monitor wafer 110 after the coarse grinding process is performed, in accordance with embodiments of the present invention.

In the embodiments described above, right after the coarse grinding process is performed, the 4-point RS measuring probe can be used to measure the sheet resistance of the resulting monitor wafer 110, and from the results, it is determined whether the dopant layer 112 is completely removed.

Next, in one embodiment, the fine grinding process is performed on the top surface 116 (FIG. 3B) of the monitor wafer 110 (i.e., the surface on which the coarse grinding process is performed). Illustratively, the fine grinding process can be performed using a fine grinding tool (not shown) which is similar to the coarse grinding tool 300 except that the dimensions of the diamond particles 322 in the fine grinding tool is smaller than the dimensions of the diamond particles 322 in the coarse grinding tool 300. In one embodiment, the operation of the fine grinding tool is similar to the operation of the coarse grinding tool 300. Illustratively, the fine grinding process helps get rid of the silicon lattice damage at top surface 116 of the monitor wafer 110 created by the coarse grinding process resulting in a smooth top surface 116 of the resultant monitor wafer 110. It should be noted that, the wafer removal rate is higher in the coarse grinding process than in the fine grinding process.

In summary, the dopant layer 112 (FIG. 1B) of the monitor wafer 110 (FIG. 1B) is removed by using the coarse grinding process followed by the fine grinding process. More specifically, the coarse grinding process removes the dopant layer 112 of the monitor wafer 110 and then the fine grinding process helps get rid of the silicon lattice damage at top surface 116 (FIG. 3B) of the monitor wafer 110 (FIG. 3B) created by the coarse grinding process resulting in the smooth top surface 116 of the resultant monitor wafer 110. In an alternative embodiment, the fine grinding process can be omitted. In one embodiment, both the coarse grinding process and the fine grinding process can be performed in that order in a conventional back-side grinding tool (not shown).

Figure 4:
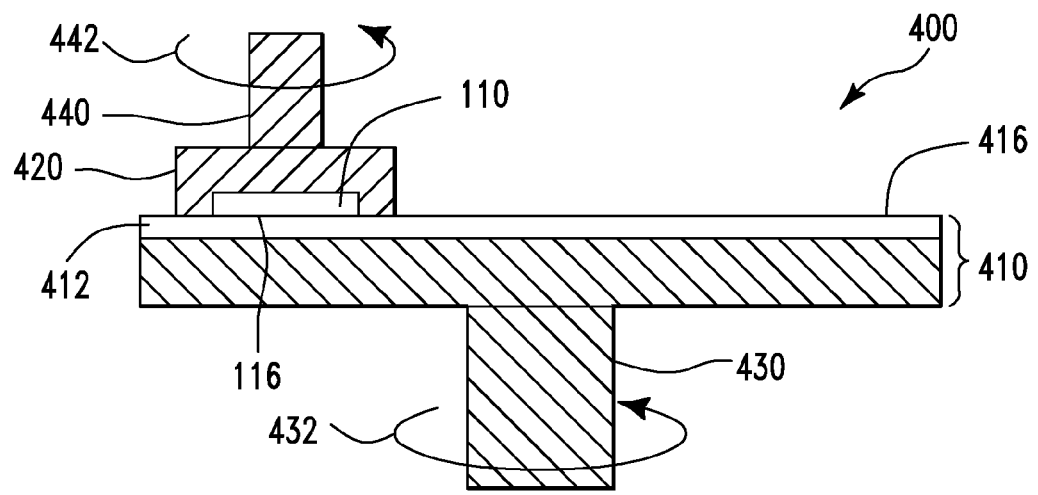
FIG. 4 shows a cross-section view of a chemical mechanical polishing (CMP) apparatus, in accordance with embodiments of the present invention.

Next, with reference to FIG. 2, in step 220, in one embodiment, the top surface 116 (FIG. 4) of the monitor wafer 110 (FIG. 4) is polished by a chemical mechanical polishing (CMP) process using a CMP apparatus 400 (shown in FIG. 4). FIG. 4 shows a cross-section view of the CMP apparatus 400, in accordance with embodiments of the present invention. More specifically, in one embodiment, the CMP apparatus 400 comprises a polishing wheel 410 and a chuck 420. Illustratively, the polishing wheel 410 comprises a polishing pad 412 which is generally a planar pad made from a continuous phase matrix material such as polyurethane. In one embodiment, the monitor wafer 110 is physically attached to the chuck 420 such that the top surface 116 of the monitor wafer 110 is in direct physical contact with the top surface 416 of the polishing pad 412.

In one embodiment, the CMP apparatus 400 further comprises a rotary driving unit 430 connected to the polishing wheel 410 and a rotary driving unit 440 connected to the chuck 420. Illustratively, the rotary driving unit 430 rotates in a direction indicated by arrow 432 resulting in the polishing wheel 410 rotating in the same direction. In one embodiment, the rotary driving unit 440 rotates in a direction indicated by arrow 442 resulting in the chuck 420 rotating in the same direction. Illustratively, the chuck 420 comes down on the top surface 416 of the polishing pad 412 such that the entire top surface 116 of the monitor wafer 110 is in direct physical contact with the top surface 416 of the polishing pad 412.

In one embodiment, slurry and a basic solution (not shown) are dripped onto the top surface 416 of the polishing pad 412 and are thereby dispensed through the interface between the top surface 416 of the polishing pad 412 and the top surface 116 of the monitor wafer 110. Illustratively, the slurry contains abrasive particles made of material such as silicon dioxide. As a result, the top surface 116 of the monitor wafer 110 is polished by the action of the polishing pad 412, monitor wafer 110, and the basic solution and the slurry disposed there between. The basic solution helps dissolve silicon on top surface 116 of the monitor wafer 110. This is to ensure that the top surface 116 of the monitor wafer 110 is clean and has no residue left after the CMP process is performed. In one embodiment, the basic solution has a pH value of about ten.

In one embodiment, after the step 220 is performed, the top surface 116 of the monitor wafer 110 can be cleaned using a Huang A solution ($NH_4OH/H_2O_2/H_2O$) and/or a Huang B solution ($HCl/H_2O_2/H_2O$). More specifically, the Huang A solution can remove organic materials, whereas the Huang B solution can remove metallic materials. It should be noted that the Huang A and/or Huang B solutions remove the organic and metallic materials without affecting silicon lattice of the monitor wafer 110. In one embodiment, after the cleaning using the Huang A solution and/or the Huang B solution, the monitor wafer 110 is annealed using a conventional method such as RTA. After that, the monitor wafer 110 can be reused for monitoring the dopant implantation process. Alternatively, the cleaning using the Huang A solution and/or the Huang B solution and the annealing of the monitor wafer 110 can be omitted. As a result, the monitor wafer 110 can be reused for monitoring the dopant implantation process right after the CMP process is performed.

Figure 5A:
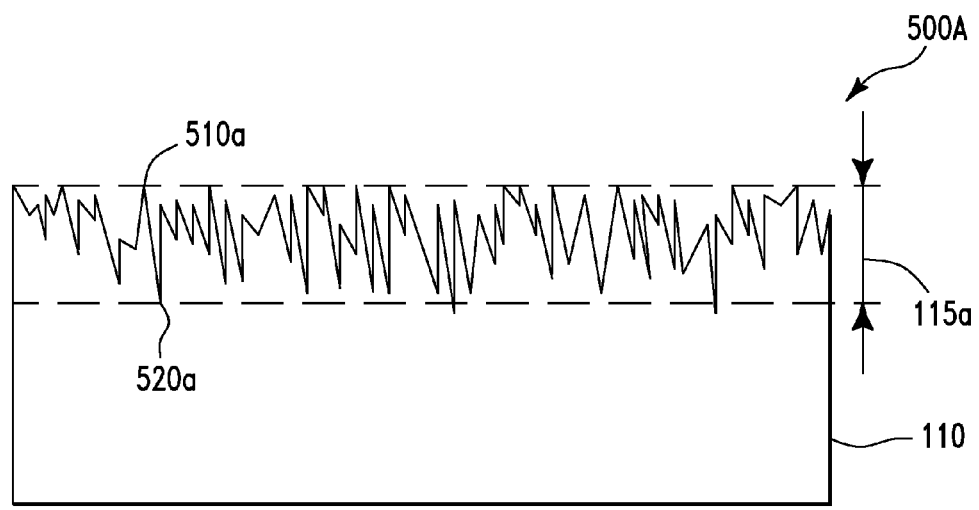
FIG. 5A shows a cross-section view of the monitor wafer of FIG. 1B after removing a dopant layer is performed, in accordance with embodiments of the present invention.

FIG. 5A shows a cross-section view of the monitor wafer 110 after the step 210 of FIG. 2 is performed, in accordance with embodiments of the present invention. More specifically, after the step 210 is performed, the top surface of the monitor wafer 110 has a maximum roughness height 115a (also called Rmax 115a), wherein Rmax 115a is the maximum vertical distance between two adjacent peak and valley of the top surface of the monitor wafer 110. More specifically, Rmax 115a is vertical between the two adjacent peak 510a and valley 520a. In one embodiment, the Rmax 115a is about 77 nanometers.

Figure 5B:
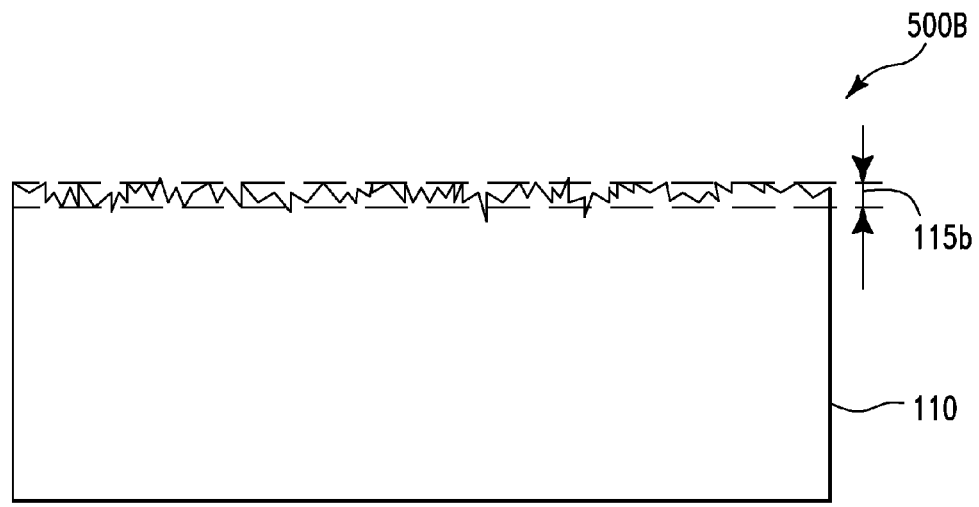
FIG. 5B shows a cross-section view of the monitor wafer of FIG. 1B after removing a dopant layer and polishing the monitor wafer of FIG. 1B are performed, in accordance with embodiments of the present invention.

FIG. 5B shows a cross-section view of the monitor wafer 110 after the step 220 of FIG. 2 is performed, in accordance with embodiments of the present invention. More specifically, after the step 220 is preformed, the top surface of the monitor wafer 110 has a maximum roughness height 215b (also called Rmax 215b). In one embodiment, Rmax 215b is about 8.7 nanometers. As a result, the Rmax 215b (8.7 nm) is much smaller than the Rmax 115a (77 nm) in case of FIG. 5A. As a result, it can be determined that the top surface of the monitor wafer 110 of FIG. 5B is smoother than the top surface of the monitor wafer 110 of FIG. 5A. This indicates that the CMP process has made the top surface of the monitor wafer 110 smoother.

In summary, the monitor wafer 110 (i) is grinded to remove the dopant layer 112 by using the two-step grinding process (the step 210 of FIG. 2) and then (ii) is polished by using the CMP apparatus 400 (the step 220 of FIG. 2). It should be noted that the top surface of the monitor wafer 110 after performing the step 220 is smoother than the top surface of the monitor wafer 110 after performing the step 210. It should be noted that, after performing the method 200 of FIG. 2, the monitor wafer 110 can be reused for monitoring the dopant implantation process.

In one embodiment, before the removal of the dopant layer 112 (FIG. 1B) using the coarse grinding tool (FIG. 3A), no chemical etching (wet etch or dry etch) is performed on the dopant layer 112.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A wafer processing method, comprising:
providing a semiconductor wafer which includes (i) a semiconductor layer and (ii) a dopant layer on top of the semiconductor layer,
wherein the dopant layer comprises first dopants;
removing the dopant layer from the semiconductor wafer, wherein no chemical etching is performed on the dopant layer before said removing the dopant layer is performed; and
implanting second dopants in the resulting semiconductor wafer after said removing the dopant layer from the semiconductor wafer is performed, wherein said implanting second dopants in the resulting semiconductor wafer generates a monitor wafer configured to monitor a dopant implementation process.

2. The method of claim 1, wherein said removing the dopant layer from the semiconductor wafer comprises coarse grinding the dopant layer until the dopant layer is completely removed using a coarse grinding wheel.

3. The method of claim 2, wherein said removing the dopant layer from the semiconductor wafer further comprises fine grinding a top surface of the semiconductor wafer on which the dopant layer resided using a fine grinding wheel other than the coarse grinding wheel.

4. The method of claim 3, wherein the coarse grinding wheel and the fine grinding wheel are parts of a same backside grinding tool.

5. The method of claim 2, further comprising measuring a resistance of the semiconductor wafer after said removing the dopant layer from the semiconductor wafer is performed so as to determine whether the dopant layer is completely removed.

6. The method of claim 1, further comprising performing a chemical mechanical polishing (CMP) process on a top surface of the semiconductor wafer on which the dopant layer resided using a CMP apparatus.

7. The method of claim 6, further comprising, after said performing the CMP process is performed, cleaning the top surface of the semiconductor wafer using a Huang A solution.

8. The method of claim 7, wherein the Huang A solution comprises $NH_4OH/H_2O/H_2O$.

9. The method of claim 6, further comprising, after said performing the CMP process is performed, cleaning the top surface of the semiconductor wafer using a Huang B solution.

10. The method of claim 9, wherein the Huang B solution comprises $HCl/H_2O_2/H_2O$.

11. The method of claim 6, further comprising annealing the semiconductor wafer after said CMP process is performed.

12. The method of claim 11, wherein said annealing the semiconductor wafer comprises performing a rapid thermal anneal on the semiconductor wafer.

13. The method of claim 6, wherein said performing the chemical mechanical polishing process comprises adding silicon dioxide slurry to a space between the semiconductor wafer and a polishing wheel of the CMP apparatus.

14. The method of claim 13, wherein said performing the chemical mechanical polishing process further comprises adding a basic solution to the space between the semiconductor wafer and the polishing wheel of the CMP apparatus.

15. The method of claim 14, wherein the basic solution has a pH value of about ten.

16. The method of claim 6, wherein said performing the chemical mechanical polishing process is performed until a maximum roughness height of the top surface of the semiconductor wafer on which the dopant layer resided does not exceed about 20 nanometers.

17. The method of claim 1, wherein said semiconductor wafer is a first monitor wafer, and wherein said method further comprises:
before said providing, monitoring by said first monitor wafer, a first dopant implementation process; and
after said implanting said second dopants, monitoring by said monitor wafer, a second dopant implementation process.

18. The method of claim 1, wherein said removing the dopant layer from the semiconductor wafer comprises using a grinding wheel comprising diamond particles, and wherein said every point on the top surface of the dopant layer comes into contact with the diamond particles resulting in the dopant layer thinned until the dopant layer is removed from the wafer.

19. The method of claim 1, wherein after said removing the dopant layer from the semiconductor wafer, a top surface of the semiconductor wafer comprises a maximum roughness height comprising a maximum vertical distance between two adjacent peaks and valleys on the top surface of the semiconductor wafer, and wherein said maximum roughness height is about 77 nanometers.

20. A wafer processing method, comprising:
providing a semiconductor wafer which includes (i) a semiconductor layer and (ii) a dopant layer on top of the semiconductor layer,
wherein the dopant layer comprises first dopants;

measuring a dose of the dopant layer of the semiconductor wafer; removing the dopant layer from the semiconductor wafer;

performing a chemical mechanical polishing (CMP) process on a top surface of the semiconductor wafer on which the dopant layer resided a using CMP apparatus; and implanting second dopants in the resulting semiconductor wafer after said removing the dopant layer from the semiconductor wafer is performed, wherein said implanting second dopants in the resulting semiconductor wafer generates a monitor wafer configured to monitor a dopant implementation process.

21. The method of claim 20, wherein the semiconductor wafer comprises silicon.

22. The method of claim 20, wherein said removing the dopant layer from the semiconductor wafer comprises coarse grinding the dopant layer until the dopant layer is completely removed using a coarse grinding wheel.

23. The method of claim 22, wherein said removing the dopant layer from the semiconductor wafer further comprises fine grinding a top surface of the semiconductor wafer on which the dopant layer resided using a fine grinding wheel other than the coarse grinding wheel.

24. The method of claim 23, wherein the coarse grinding wheel and the fine grinding wheel are parts of a same backside grinding tool.

25. The method of claim 22, further comprising measuring a resistance of the semiconductor wafer after said removing the dopant layer from the semiconductor wafer is performed so as to determine whether the dopant layer is completely removed.

26. The method of claim 20, further comprising, after said performing the CMP process is performed, cleaning the top surface of the semiconductor wafer using a Huang A solution.

27. The method of claim 26, wherein the Huang A solution comprises $NH_4OH/H_2O_2/H_2O$.

28. The method of claim 20, further comprising, after said performing the CMP process is performed, cleaning the top surface of the semiconductor wafer using a Huang B solution.

29. The method of claim 28, wherein the Huang B solution comprises $HCl/H_2O_2/H_2O$.

30. The method of claim 20, further comprising annealing the semiconductor wafer after said CMP process is performed.

31. The method of claim 30, wherein said annealing the semiconductor wafer comprises performing a rapid thermal anneal on the semiconductor wafer.

32. The method of claim 20, wherein said performing the chemical mechanical polishing process comprises adding silicon dioxide slurry to a space between the semiconductor wafer and a polishing wheel of the CMP apparatus.

33. The method of claim 32, wherein said performing the chemical mechanical polishing process further comprises adding a basic solution to the space between the semiconductor wafer and the polishing wheel of the CMP apparatus.

34. The method of claim 33, wherein the basic solution has a pH value of about ten.

35. The method of claim 20, wherein said performing the chemical mechanical polishing process is performed until a maximum roughness height of the top surface of the semiconductor wafer on which the dopant layer resided does not exceed about 20 nanometers.

36. A wafer processing method, comprising:

providing a semiconductor wafer which includes (i) a semiconductor layer and (ii) a dopant layer on top of the semiconductor layer, wherein the dopant layer comprises first dopants;

removing the dopant layer from the semiconductor wafer;
  wherein no chemical etching is performed on the dopant layer before said removing the dopant layer is performed;

performing a chemical mechanical polishing (CMP) process on a top surface of the semiconductor wafer on which the dopant layer resided using a CMP apparatus; and implanting second dopants in the resulting semiconductor wafer after said removing the dopant layer from the semiconductor wafer is performed, wherein said implanting second dopants in the resulting semiconductor wafer generates a monitor wafer configured to monitor a dopant implementation process.

37. The method of claim 36, wherein said performing the chemical mechanical polishing process is performed until a maximum roughness height of the top surface of the semiconductor wafer on which the dopant layer resided does not exceed about 20 nanometers.

* * * * *